Figure 1:
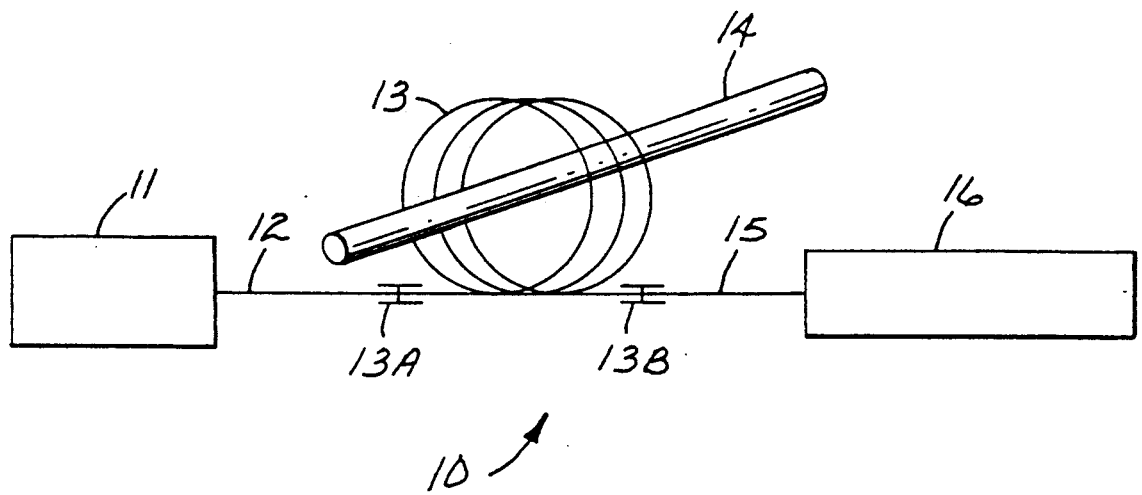

United States Patent [19]

Lutz et al.

[11] Patent Number: 5,051,577
[45] Date of Patent: Sep. 24, 1991

[54] FARADAY EFFECT CURRENT SENSOR HAVING TWO POLARIZING FIBERS AT AN ACUTE ANGLE

[75] Inventors: Dale R. Lutz; Grieg A. Olson; Gary B. Forsberg, all of St. Paul, Minn.

[73] Assignee: Minnesota Mining and Manufacturing Company, Saint Paul, Minn.

[21] Appl. No.: 496,291

[22] Filed: Mar. 20, 1990

[51] Int. Cl.$^5$ ................................................ H01J 5/16
[52] U.S. Cl. .......................... 250/227.17; 250/227.24; 324/96
[58] Field of Search ................ 250/227.17, 231.1, 225; 324/96; 350/96.15, 96.18, 96.29, 96.30

[56] References Cited

U.S. PATENT DOCUMENTS

| | | | |
|---|---|---|---|
| 4,070,620 | 1/1978 | Feldtkeller et al. | 324/96 |
| 4,255,018 | 3/1981 | Ulrich et al. | 324/96 |
| 4,298,245 | 11/1981 | Aulich et al. | 324/96 |
| 4,531,811 | 7/1985 | Hicks, Jr. | 350/96.15 |
| 4,589,728 | 5/1986 | Dyott et al. | 350/96.15 |
| 4,615,582 | 10/1986 | LeFevre et al. | 350/96.15 |
| 4,853,534 | 8/1989 | Dakin | 250/227.17 |
| 4,894,608 | 1/1990 | Ulmer, Jr. | 324/96 |

*Primary Examiner*—David C. Nelms
*Assistant Examiner*—Que Tan Le
*Attorney, Agent, or Firm*—Gary L. Griswold; Walter N. Kirn; Stephen W. Buckingham

[57] ABSTRACT

In known Faraday effect current sensors, light is fed into a polarizer, through a coil of field-sensitive optical fiber, and into a polarization measuring device. Such a current sensor can provide greater accuracy of current measurement by using a polarizing optical fiber as its polarizer and splicing the polarizing fiber to the input end of the optical fiber coil. The exit end of the optical fiber coil can be spliced to a second polarizing optical fiber, the other end of which is optically connected to a photodetector. In another embodiment, a mirror at the exit end of the optical fiber coil reflects light back through the coil to second and third polarizing fibers which in turn are optically connected to a pair of photodetectors, thus doubling the Faraday rotation while canceling out reciprocal optical effects.

13 Claims, 2 Drawing Sheets

FARADAY EFFECT CURRENT SENSOR HAVING TWO POLARIZING FIBERS AT AN ACUTE ANGLE

BACKGROUND OF THE INVENTION

1. Field of the Invention

The invention concerns a Faraday effect current sensor that has a coil of optical fiber through which is passed a conductor carrying current to be measured.

2. Description of the Related Art

Day et al.: "Faraday Effect Sensors: The State of the Art" *Proc. SPIE*, Vol. 985, pp 1–13 (1988) points out:

"Faraday effect current sensors are now used routinely in the measurement of large current pulses, and are starting to become available for ac current measurements in the power industry... They have several advantages. They can be constructed completely from dielectric materials, which is very important when operating at high voltage or in the presence of substantial electromagnetic interference. They are faster than other types of optical sensors for magnetic fields.... The principal disadvantage of Faraday effect sensors is generally thought to be their lack of sensitivity. Recent work has shown dramatic improvement in sensitivity, however, and further gains can be foreseen" (p. 1).

After describing a Faraday effect current sensor that employs a coil of optical fiber, the Day publication points out (at page 4) that "the primary difficulty with fiber current sensors is that linear birefringence in the fiber ... can seriously distort the response function" and (at page 5): "One technique for overcoming induced linear birefringence is to twist the fiber" to induce circular birefringence. Among other techniques discussed in the Day publication are to anneal the coil of optical fiber or to employ an optical fiber having high inherent circular birefringence.

U.S. Pat No. 4,255,018 (Ulrich et al.) concerns a Faraday effect current sensor wherein a conductor passes through a coil of optical fiber. Light from a polarizer is focused into the coiled optical fiber at its input end, and light that exits from the optical fiber is collimated and transmitted to an optical polarization analyzer, a photoelectric detector system, and a measuring instrument which together can be called a "polarization measuring device." The Ulrich invention is to twist the coiled optical fiber to produce a degree of "circular double refraction" that compensates for or suppresses, the "linear double refraction," those terms being synonymous with "circular birefringence" and "linear birefringence," respectively.

Ulrich's Faraday effect current sensor is similar to that of U.S. Pat No. 3,605,013 (Yoshikawa) which suggests that the "light" (polarization) axes of the polarizer and optical polarization analyzer should form an angle of 45° and that the analyzer "is effective to derive a rotatory polarization component produced in proportion to the current" in an electrical conductor (col. 2, lines 34–37).

Chatrefou et al.: "Faraday Effect Current Sensor. Design of a Prototype" (a paper presented at the Workshop on the Role of Optical Sensors in Power Systems Voltage and Current Measurements, Gaithersburg, MD, Sept. 16–18, 1987) shows a Faraday effect current sensor much like that of Yoshikawa except that the light is reflected back through the coil to a semi-transparent mirror before reaching an analyzer "By having the light do a forward-return travel, by reflection at the fiber end (see FIG. 1), Faraday rotation is doubled, whereas rotation due to optical activity cancels out" (p 3).

Laming et al.: "Compact Optical Fibre Current Monitor with Passive Temperature Stabilization" (a paper presented at the Optical Fiber Sensors Topical Meeting of Optical Society of America, Washington, DC, Jan. 27–29, 1988) shows a Faraday effect current sensor much like that of the Chatrefou publication. In the Laming sensor, the light passes through collimators and a beam splitter both before and after passing through a 45° polarizer. Then light transmitted by the coil passes through a third collimator and is reflected by a mirror back through the third and second collimators to the beam-splitter and on to a polarizing beam-splitter. By passing through so many interfaces, the light is significantly attenuated.

Another Faraday effect current sensor in which the light is reflected back through the coil is described in U.K. Pat. Appln. GB 2,104,213A, published 2 Mar. 1983.

Additional Faraday effect current sensors that employ optical fibers are described in U.S. Pat. No. 4,070,620 (Feldtkeller et al.); U.S. Pat. No. 3,590,374 (Evans et al.); and U.S. Pat. No. 3,419,802 (Pelenc et al.).

Other Prior Art

Single-mode optical fibers are known that propagate only one polarization state of the fundamental mode and so can be employed as polarizers. See, for example, U.S. Pat. No. 4,515,436 (Howard et al.) which describes a single-polarization optical fiber that preferably is stressed by being coiled or otherwise bent in order to have a broader bandwidth. Other single-polarization optical fibers are described in Simpson et al.: "A Single-Polarization Fiber" *J. of Lightwave Tech*, Vol LT-1, No. 2, pp 370–373 (1983); Simpson et al.: "Properties of Rectangular Polarizing and Polarization Maintaining Fiber" *Proc. SPIE*, Vol. 719, pp 220–225 (1986); Stolen et al.: "Short W-Tunneling Fibre Polarizers" *Elec. Lett.*, Vol. 24, pp 524–525 (1988); Okamoto et al.: "High-Birefringence Polarizing Fiber with Flat Cladding" *J. of Lightwave Tech*, Vol. LT-3, No. 4, pp 758–762 (1985); Onstott et al.; "Polarization Controlling Optical Fibers," *SPIE*, Vol. 719, *Fiber Optic Gyros*: 10 th Anniversary Conference, Bellingham, WA; and Messerly et al.: "Broadband Single Polarization Optical Fiber," *Optical Fiber Communication Conference*, 22–26 Jan. 1990, San Francisco, CA. A single-polarization optical fiber is below called a "polarizing fiber."

Summary of the Invention

As compared to prior Faraday effect current sensors that have field-sensitive optical fiber coils, that of this invention is improved in several respects: the novel Faraday effect current sensor can be (1) more compact, (2) more transmissive of the sensing light, and (3) less sensitive to extraneous fields so that it can provide greater accuracy of current measurement.

Like Faraday effect current sensors of the prior art, that of the invention employs (a) a source of light, such as a laser, which is fed into (b) a polarizer and then into (c) a coil of field-sensitive optical fiber through which an electrical conductor to be monitored can be passed, and from the coil into (d) a polarization measuring device.

The Faraday effect current sensor of the invention differs from those of the prior art in that the polarizer is a polarizing optical fiber which is spliced to the input end of the opical fiber coil, either directly or through a polarization-maintaining optical fiber. The exit end of the optical fiber coil can be spliced to a second polarizing fiber which acts as an optical polarization analyzer such that the polarization axes of the two polarizing optical fibers form an acute angle, ideally 45°. In doing so, the response in output light intensity from the second polarizing fiber to a change in current through the electrical conductor is substantially linear. The other end of the second polarizing fiber can be optically connected to a photodetector. The second polarizing fiber and the photodetector act together as a polarization measuring device. Both splices can be bound into the coil. By doing so, extraneous magnetic fields have substantially no net effect upon the signal produced in the field-sensitive optical fiber.

Other embodiments of the Faraday effect current sensor of the invention are shown in the drawings. In one, a mirror at the exit end of the optical fiber coil can reflect light back through the coil to second and third polarizing optical fibers which in turn are optically connected to a pair of photodetectors, thus doubling the Faraday rotation while canceling out reciprocal optical effects.

The Faraday effect current sensor of the invention eliminates a bulk polarizer such as is used in each of the above-discussed prior sensors and also does not require a bulk optical polarization analyzer. Accordingly, the novel Faraday effect current sensor can be more compact than was heretofore possible and should be less likely to become misaligned.

Field-sensitive optical fibers useful for the current-sensing coil are described in the Day publication and the Ulrich patent.

In preferred embodiments of the Faraday effect current sensor of the invention, the source of light is a laser, and the first-mentioned polarizing optical fiber is optically coupled to the laser, either directly or through another optical fiber. The other end of the polarizing fiber is fused or otherwise so connected to the input end of the field-sensitive optical fiber coil that there is no air interface. When the novel Faraday effect current sensor includes one or more additional polarizing optical fibers, each is preferably so connected to the optical fiber coil that there is no air interface, thus providing reduced light attenuation as compared to Faraday effect current sensors of the prior art.

THE DRAWINGS

Figure 2:
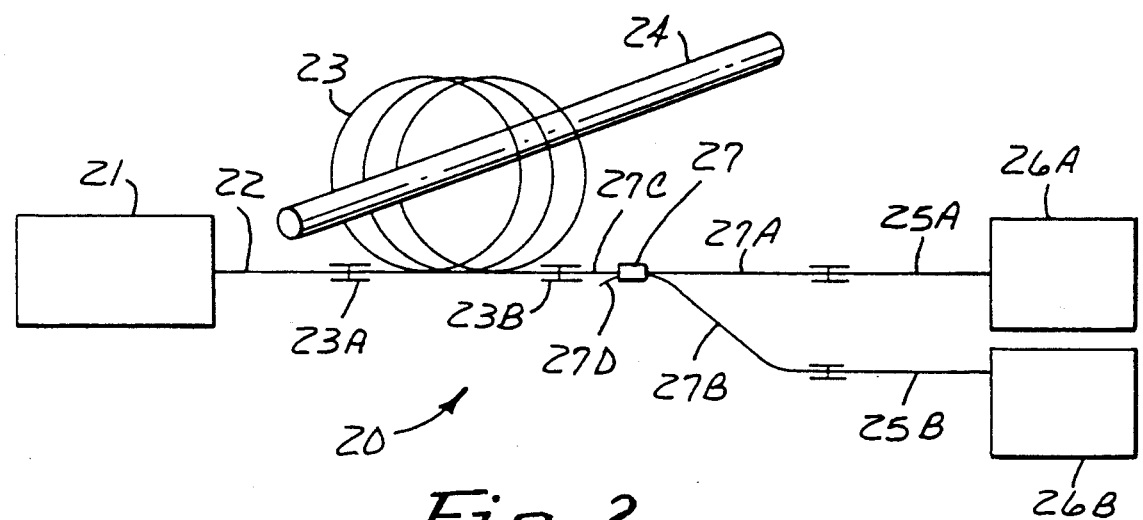
Figure 3:
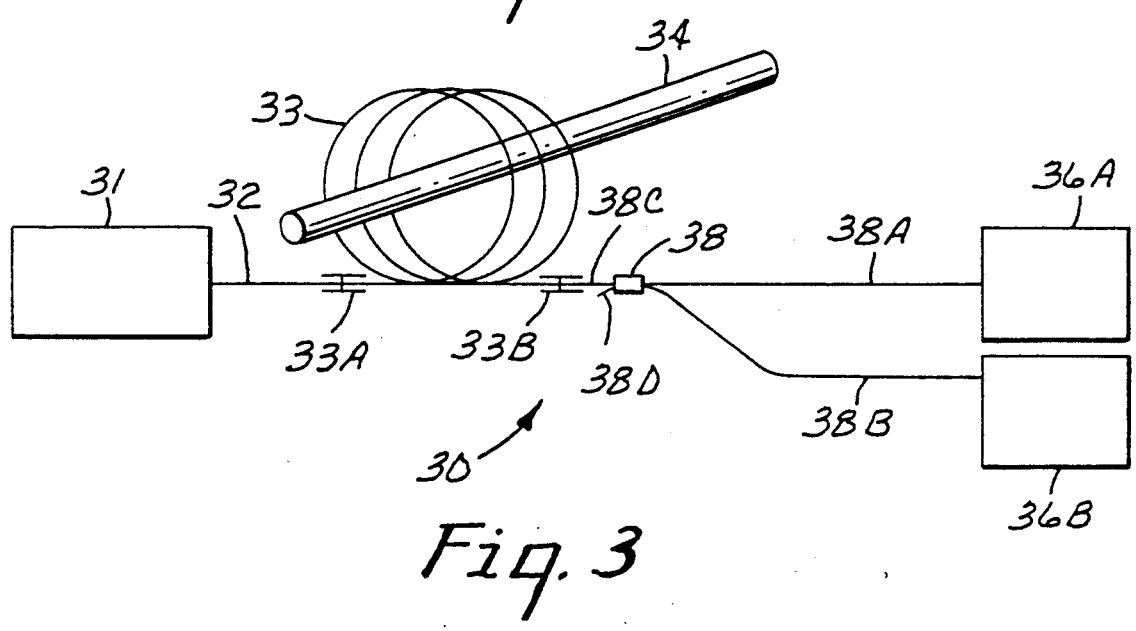
Figure 4:
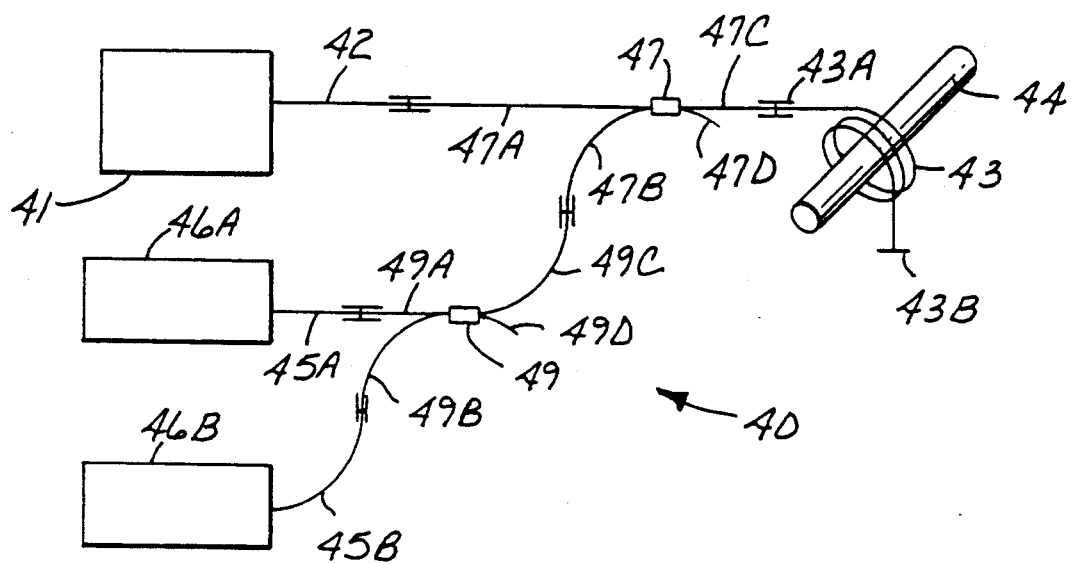
Figure 5:
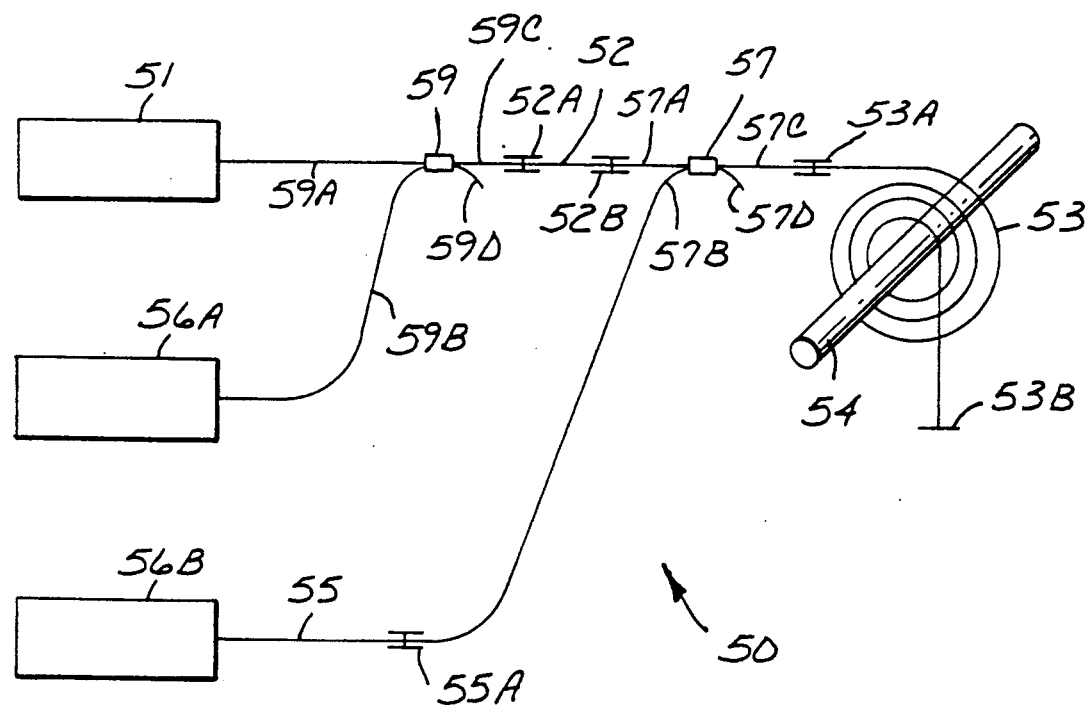

The invention may be more easily understood in reference to the drawings, in which:

FIG. 1 diagrammatically shows a first Faraday effect current sensor of the invention;

FIG. 2 diagrammatically shows a second Faraday effect current sensor of the invention;

FIG. 3 diagrammatically shows a third Faraday effect current sensor of the invention;

FIG. 4 diagrammatically shows a fourth Faraday effect current sensor of the invention; and FIG. 5 diagrammatically shows a fifth Faraday effect current sensor of the invention.

In the Faraday effect current sensor 10 of FIG. 1, light from a laser 11 is fed into one end of a first polarizing optical fiber 12, the other end of which is spliced at 13A to the input end of a coil of field-sensitive optical fiber 13 through which an electrical conductor 14 passes. The exit end of the field-sensitive optical fiber is spliced at 13B to a second polarizing optical fiber 15 from which light is directed into a photodetector 16. After the splices 13A and 13B have been made, those portions of the field-sensitive optical fiber preferably are wound up into the coil.

Each of the splices 13A and 13B preferably is fused to avoid an air interface and to aid in maintaining optical alignment and mechanical stability. Before fusing the second splice 13B, the polarization of light from the field-sensitive fiber 13 should be tested so that the polarization axis of the exiting light, when no current is flowing in the conductor 14, is at a desired angle with respect to the polarization axis of the second polarizing fiber 15, preferably 45°. In that test, it is desirable to compensate for any shift in polarization that may occur when the second splice is subsequently wound into the coil.

In each of FIGS. 2–5, reference characters having like units digits refer to components comparable to those of FIG. 1 and hence may not be otherwise described.

The second Faraday effect current sensor 20 of FIG. 2 is like that of FIG. 1 except as follows. A polarization-maintaining coupler 27 has first and second pairs of leads 27A, 27B and 27C, 27D, respectively. One lead 27C of the second pair is spliced at 23B to the exit end of the coil of field-sensitive optical fiber 23. The leads 27A and 27B of the first pair are spliced to second and third polarizing fibers 25A and 25B, respectively, which in turn are optically connected to a pair of photodetectors 26A and 26B, respectively. The polarization axes of lead 27C are preferably at an angle of 45° to the plane of polarization of the light exiting the coil of field-sensitive optical fiber when there is no current in the electrical conductor 24. The polarization axes of fibers 25A and 25B are preferably oriented so that each matches a different polarization axis of the polarization-maintaining coupler fiber leads 27A and 27B, such that when there is no current in the electrical conductor, the intensity of light transmitted through one of the second and third polarizing fibers 25A and 25B will be a maximum while the intensity of light transmitted through the other will be a minimum.

The third Faraday effect current sensor 30 of FIG. 3 is like that of FIG. 1 except as follows. A polarization splitter 38 has first and second pairs of leads 38A, 38B and 38C, 38D, respectively. One lead 38C of the second pair is spliced at 33B to the exit end of the coil of field-sensitive optical fiber 33. The leads 38A and 38B of the first pair are optically connected to a pair of photodetectors 36A and 36B, respectively. The polarization axes of lead 38C are preferably oriented at 45° with respect to the plane of polarization of the light which exits the field-sensitive fiber coil 33 when there is no current flowing in the electrical conductor 34.

The fourth Faraday effect current sensor 40 of FIG. 4 has a first polarization-maintaining coupler 47 that has two pairs of leads 47A, 47B and 47C, 47D. A first polarizing fiber 42 is spliced to one lead 47A of the first pair, and one lead 47C of the second pair is spliced at 43A to the input end of a coil of field-sensitive optical fiber 43. At the exit end of the optical fiber 43 is a mirror 43B which reflects light back through the coil to the lead 47C and through the first polarization-maintaining coupler 47 and the other lead 47B of its first pair of leads to a lead 49C of a second polarization-maintaining coupler 49; and from there to a pair of its leads 49A and 49B which are spliced to second and third polarizing fibers 45A and 45B, respectively, each of which is optically connected to one of a pair of photodetectors 46A and 46B, respectively. One of the polarization axes of lead 47A is preferably aligned with the polarization axis of the first polarizing fiber 42. The polarization axes of leads 47B and 49C are mutually aligned. The polarization axes of second and third polarizing fibers 45A and 45B are aligned to opposite axes of leads 49A and 49B, such that (ideally) when there is no current flowing in the electrical conductor 44, the intensity of the light transmitted through one of the second and third polarizing fibers would be a maximum while the intensity of light transmitted through the other would be a minimum.

The Faraday effect current sensor of FIG. 4 could be modified by replacing its polarization measuring device (polarization maintaining coupler 49, polarizing fibers 45A and 45B, plus photodetectors 46A and 46B) with the polarization measuring device of either FIG. 1 or FIG. 3.

Like that of FIG. 4, the fifth Faraday effect current sensor 50 of FIG. 5 has at the exit end of a coil of field-sensitive optical fiber 53 a mirror 53B which reflects light back through the coil. The reflected light passes through a lead 57C of the polarization-maintaining coupler 57 which is spliced to the coil and through both of its input leads 57A and 57B to a pair of photodetectors 56A and 56B, respectively. (In the case of detector 56A, the reflected light is directed to the detector by means of a second polarization-maintaining coupler 59.) The polarization axis of a first polarizing fiber 52 would preferably be aligned with one of the polarization axes of each polarization-maintaining coupler 57 and 59. The polarization axis of the second polarizing fiber 55 would be aligned with the other polarization axis of lead 57B. The polarization of the reflected light should be biased to an angle of 45°, e.g., by running a second conductor with a bias current through the center of the fiber coil or by adding a fixed Faraday rotator, preferably at 53A.

As compared to the current sensor of FIG. 4, that of FIG. 5 has only four (vs. five) splices 52A, 52B, 53A and 55A and only two (vs. three) polarizing optical fibers 52 and 55. On the other hand, as compared to the current sensor of FIG. 4, that of FIG. 5 is more difficult to calibrate to avoid possible errors due to birefringence in the polarization-maintaining coupler fibers.

When there is only one photodetector as in FIG. 1, the intensity of the component of light at the photodetector provides the only measure of the amplitude of current flowing through the electrical conductor. When there are two photodetectors, the intensities of the components of light at the two can be compared to show the amplitude of current. By doing so, current measurements can be made to be substantially independent of fluctuations in intensity of the light source. Even so, the current sensor of FIG. 1 may be preferred for some applications because of its simplicity and inherently lower cost.

When a Faraday effect current sensor of the invention has two photodetectors, their electrical outputs probably would not be precisely equal at zero current in the electrical conductor. Hence, the current sensor should be calibrated to allow for this.

For convenience in packaging, the novel current sensor, except for the light source and photodetector(s), can be potted in toroidal form in a resin, to form a sensing head which can be optically connected through optical fibers to the light source and photodetector(s) that are maintained at a remote location. The connecting fibers can be ordinary optical fibers, e.g., telecommunication fibers, which may for convenience be attached by means of rematable connectors or reusable mechanical splices. However, the use of an ordinary optical fiber would tend to result in a 50 percent loss of light after being inputed into the first polarizing fiber. This loss can be substantially reduced by employing a polarized light source such as a laser diode and connecting this to the sensing head by a properly oriented polarization-maintaining optical fiber. The use of a polarization-maintaining optical fiber minimizes errors from fluctuations in the polarization state of the light reaching the first polarizing fiber, e.g., fluctuations due to bends or mechanical stresses in the transmission fiber. For increased life and lower cost, the light source can be an unpolarized source such as a surface-emitting light emitting diode.

If desired, an electrical conductor can be built into the sensing head and fitted with electrical connectors for ease of insertion into an electrical circuit. In the packaging of the reflection-mode current sensors of FIGS. 4 and 5, it may be desirable for the sensing head to contain only the field-sensitive fiber coil and the mirror, with the other elements at the remote location. Doing so permits a single polarization-maintaining optical fiber to connect the sensing head to the elements at the remote location. In order to provide a connection means, a short length of polarization-maintaining optical fibers can be potted into the sensing head.

EXAMPLE 1

The Faraday effect current sensor 10 of FIG. 1 has been constructed of the following:

| | |
|---|---|
| laser 11: | Sharp LTO 15MD0 laser diode, peak wavelength 839 nm |
| polarizing fibers 12,15: | single mode |
| cladding diameter | 78 μm |
| length | 5 m |
| field-sensitive fiber 13: | low birefringence, single mode (EOTec lot #61061, similar to EOTec product no. FS-LB-4211) |
| cladding diameter | 95 μm |
| length | 2.7 m |
| coil diameter | 8.6 cm |
| no. of turns | 10 |
| no. of twists per meter | 0 |
| photodetector 16: | United Detector Technology (UDT) PIN 10DP photodiode (with UDT model 101C transimpedance amplifier) |

Splices 13A and 13B were made by means of a 3M model 2100 fusion splicer which had been modified to permit rotation of one optical fiber about its longitudinal axis and to permit use of an external photodetector for its fiber alignment program. In making the second splice, the polarization axis of the second polarizing fiber was oriented at approximately 45° to the polarization axis of the light exiting the field-sensitive fiber coil. The output end of the field-sensitive fiber was bent in such a way as to compensate for bend-induced birefringence in the coiled fiber, so that a sinusoidal modulation of the optical output signal was produced when a sinusoidally varying electrical current was passed through the sensing fiber coil.

The Faraday effect current sensor of Example 1 was tested by applying a series of sinusoidally varying electrical currents (60 Hz ranging from 0 to 600 A rms) to an electrical cable which passed through the coil of field-sensitive fiber. The optical signal was displayed by connecting the output of the photodiode transimpedance amplifier to an oscilloscope. The peak-to-peak modulation of the optical signal was measured from the oscilloscope screen, and was found to be linear with current across the full range.

EXAMPLE 2

The Faraday effect current sensor 40 of FIG. 4 has been constructed of the following:

| | |
|---|---|
| laser 41: | Sharp LTO 24MD0 laser diode, peak wavelength 789 nm |
| polarizing fibers 42,45A,45B: | single mode |
| cladding diameter | 80 μm |
| length | 5 m |
| field-sensitive fiber 43: | single mode |
| cladding diameter | 125 μm |
| length | 2.5 m |
| coil diameter | 8.6 cm |
| no. of turns | 10 |
| no. of twists | 0 |
| mirror 43B: | cleaved fiber end dipped in mercury |
| photodetectors 46A and B: | Same as in Example 1 |
| first polarization-maintaining coupler 47: | Aster coupler, serial no. PM88-0018, made with 3M fiber type 3M-0188-1, coupling ratio = 0.5 at 830 nm (~0.38 at 790 nm), extinction ratio >23 dB |
| second polarization-maintaining coupler 49: | Aster coupler, serial no. PM88-0025, similar to above coupler, extinction ratio >20 dB |

All spices were made with the fusion splicer described in Example 1. Rotational orientation alignments during fusion splicing were as follows: The polarization axis of fiber 42 was aligned to one of the polarization axes of fiber 47A. The splice between fibers 47C and 43A was randomly oriented. The polarization axes of fibers 47B and 49C were aligned to each other before splicing. The fibers for the last two splices were oriented such that when linearly polarized light is injected into fiber 49C (or 49D) with its polarization direction parallel to one of the polarization axes of the fiber, then the polarization axis of one of the second and third polarizing fibers (e.g. 45A) is rotated 45° clockwise with respect to the plane of polarization of the light emerging from fiber 49A, while the polarization axis of the other (45B) is rotated 45° counterclockwise with respect to the plane of polarization of the light emerging from fiber 49B.

The Faraday effect current sensor of Example 2 was tested as in Example 1, except that the output waveforms were displayed on a digitizing oscilloscope. The frequency of the test current in the electrical conductor was approximately 100 Hz. As the input electrical current through the conductor increased, the output of one photodetector increased while the output of the other decreased. This demonstrated that the sensor was detecting a Faraday effect polarization rotation rather than electrical "pickup" in the laser diode power supply or the photodetector electronics. The modulation frequency of the optical signal was the same as that of the electrical test current, approximately 100 Hz.

What is claimed is:

1. A Faraday effect current sensor comprising (a) a polarizer, (b) a coil of field-sensitive optical fiber, (c) means for optically connecting the input of the polarizer to a source of light and its output to the input of the field-sensitive optical fibers, and (d) means for opticaly connecting the output of the field-sensitive optical fiber to a polarization measuring device, said current sensor being characterized by the features that the polarizer is a first polarizing optical fiber which is spliced to the input end of the optical fiber coil, and said polarization measuring device comprises a second polarizing optical fiber spliced to the exit end of the optical fiber coil, and the polarization axes of the two polarizing fibers form an acute angle.

2. A Faraday effect current sensor as defined in claim 1 wherein said first polarizing fiber is spliced to the input end of the optical fiber coil through a polarization-maintaining optical fiber.

3. A Faraday effect current sensor as defined in claim 1 wherein said acute angle is 45°.

4. A Faraday effect current sensor as defined in claim 1 wherein said polarization measuring device further comprises a photodetector and means for optically connecting the second polarizing fiber to the photodetector.

5. A Faraday effect current sensor as defined in claim 1 wherein each of said polarizing fibers is spliced to the optical fiber coil by being fused thereto, and both splices are wound into the coil.

6. A Faraday effect current sensor as defined in claim 1 wherein said source of light is a laser diode, and a polarization-maintaining optical fiber optically connects the laser diode to the input of the polarizing optical fiber.

7. A Faraday effect current sensor comprising (a) a polarizer, (b) a coil of field-sensitive optical fiber, (c) means for optically connecting the input of the polarizer to a source of light and its output to the input of the field-sensitive optical fibers, and (d) means for optically connecting the output of the field-sensitive optical fiber to a polarization measuring device, said current sensor being characterized by the features that the polarizer is a first polarizing optical fiber which is spliced to the input end of the optical fiber coil and said polarization measuring device comprises second and third polarizing optical fibers, a polarization-maintaining coupler having one lead coupled to a pair of leads with said one lead spliced to the exit end of the optical fiber coil and each of said pair of leads spliced to one of the second and third polarizing fibers, a pair of photodetectors, and means for optically connecting each of the second and third polarizing fibers to one of the photodetectors.

8. A Faraday effect current sensor comprising (a) a polarizer, (b) a coil of field-sensitive optical fiber, (c) means for optically connecting the input of the polarizer to a source of light and its output to the input of the field-sensitive optical fibers, and (d) means for optically connecting the output of the field-sensitive optical fiber to a polarization measuring device, said current sensor being characterized by the features that the polarizer is a first polariziing optical fiber which is spliced to the input end of the optical fiber coil, said polarization measuring device comprises a second polarizing optical fiber spliced to the exit end of the optical fiber coil, and the polarization axes of the two polarizing fibers form an acute angle, and said sensor further comprises a mirror at the exit end of the optical fiber coil to reflect light back through the coil and said polarization-measuring device comprises a polarization-maintaining coupler having one lead caused to a pair of leads with said one lead spliced to the input end of the optical fiber coil and one of said pair of leads spliced to said polarizing fiber, a photodetector, and means for optically connecting the other of said pair of leads to said photodetector.

9. A Faraday effect current sensor as defined in claim 8 and further comprising second and third polarizing optical fibers, a second photodetector, means for optically splitting and directing the reflected light from said other of said pair of leads of the polarization-maintaining coupler into the second and third polarizing fibers, and means for optically connecting each of the second and third polarizing fibers to one of said photodetectors.

10. A Faraday effect current sensor as defined in claim 9 wherein said splitting and directing means further comprise a second polarization-maintaining coupler having one lead coupled to a pair of leads, said other lead of said pair of leads of the first-mentioned polarization-maintaining coupler being spliced to said one lead of said second polarization-maintaining coupler, and each of said pair of leads of the second polarization-maintaining coupler being spliced to one of the second and third polarizing fibers.

11. A Faraday effect current sensor as defined in claim 8 and further comprising a second polarizing optical fiber, and means for optically connecting the second polarizing fiber between said other of said pair of leads of the polarization-maintaining coupler and said photodetector.

12. A Faraday effect current sensor as defined in claim 11 and comprising a second photodetector, and means for optically splitting and directing the reflected light from said polarization-maintaining coupler to each of said photodetectors.

13. A Faraday effect current sensor as defined in claim 12 wherein said splitting and directing means further comprise a second polarization-maintaining coupler having one lead coupled to a pair of leads, said one lead of the second polarization-maintaining coupler being spliced to the input end of the first-mentioned polarizing fiber, one lead of said pair of leads of the second polarization-maintaining coupler being optically connected to the source of light, the other lead of said pair of leads of the second polarization-maintaining coupler being optically connected to said second photodetector.

* * * * *